(12) United States Patent
Buss et al.

(10) Patent No.: US 8,302,047 B2
(45) Date of Patent: Oct. 30, 2012

(54) STATISTICAL STATIC TIMING ANALYSIS IN NON-LINEAR REGIONS

(75) Inventors: Dennis Darcy Buss, Dallas, TX (US); Alice Wang, Allen, TX (US); Gordon Gammie, Plano, TX (US); Jle Gu, Dallas, TX (US); Rahul Jagdish Rithe, Cambridge, MA (US); Satyendra R. P. Raju Datla, Plano, TX (US); Sharon Hsiao-Wei Chou, Great Neck, NY (US)

(73) Assignee: Texas Instruments Incorporated, Dallas, TX (US)

( * ) Notice: Subject to any disclaimer, the term of this patent is extended or adjusted under 35 U.S.C. 154(b) by 127 days.

(21) Appl. No.: 12/766,643

(22) Filed: Apr. 23, 2010

(65) Prior Publication Data
US 2010/0287517 A1 Nov. 11, 2010

Related U.S. Application Data

(60) Provisional application No. 61/175,853, filed on May 6, 2009.

(51) Int. Cl.
*G06F 17/50* (2006.01)
*G06F 9/455* (2006.01)

(52) U.S. Cl. ........................... 716/108; 716/113
(58) Field of Classification Search .................. 716/108, 716/113
See application file for complete search history.

(56) References Cited

U.S. PATENT DOCUMENTS

| | | | | |
|---|---|---|---|---|
| 7,890,915 | B2* | 2/2011 | Celik et al. | 716/113 |
| 2006/0085775 | A1* | 4/2006 | Chang et al. | 716/6 |
| 2007/0113211 | A1* | 5/2007 | Zhang et al. | 716/6 |
| 2007/0277134 | A1* | 11/2007 | Zhang et al. | 716/6 |
| 2009/0228250 | A1* | 9/2009 | Phillips | 703/2 |
| 2009/0288051 | A1* | 11/2009 | Hemmett et al. | 716/6 |

OTHER PUBLICATIONS

Forzan et al.; "Statistical static timing analysis: A survey"; Oct. 2008; Integration, the VLSI journal 42; pp. 409-435.*
Cheng et al.; "Non-Linear Statistical Static Timing Analysis for Non-Gaussian Variation Sources"; Jun. 4, 2007; DAC 2007; pp. 250-255.*

(Continued)

*Primary Examiner* — Suresh Memula
(74) *Attorney, Agent, or Firm* — Ronald O. Neerings; Wade James Brady, III; Frederick J. Telecky, Jr.

(57) ABSTRACT

A method is described for simulating the f-sigma timing path delay of an integrated circuit design when local transistor variations determine the stochastic delay. This is achieved by determining an estimated delay time for a first timing path using non-linear operating point analysis of local variations (NLOPALV). An operating point is calculated for each cell that is included in a timing path in the integrated circuit design. The f-sigma operating point of a cell-arc is a point on the cell-arc delay function (CADF). An f-sigma delay value is determined for each cell using the selected operating point on the CADF of the cell. The determined delay values of the plurality of cells in the timing path may then be combined to predict the estimated delay for the entire timing path. The method may be extended to deal with slew rate, predict hold time statistics, prune paths, and deal with convergent paths.

16 Claims, 10 Drawing Sheets

OTHER PUBLICATIONS

David Maliniak, "Timing Analysis Rounds the Corner to Statistics, Timing-signoff flows, overburdened by corner-based analysis, evolve to encompass statistical methods", ED Online # 11664, Dec. 15, 2005.

A. Asenov, "Random Dopant Induced Threshold Voltage Lowering and Fluctuations", Electron Devices, IEEE Transactions on, vol. 45, pp. 2505-2513, 1998.

P. Andrei and I. Mayergoyz, "Random Doping-induced Fluctuations of Subthreshold Characteristics in MOSFET Devices", Solid-State Electronics, vol. 47, pp. 2055-2061, Nov. 2003.

A. Agarwal, et al "Path-based Statistical Timing Analysis Considering Inter and Intra-die Correlations", Proceedings of TAU 2002, pp. 16-21, 2002.

A. Agarwal, D. Blaauw, V. Zolotov, "Statistical Timing Analysis for Intra-die Process Variations with Spatial Correlations", Proceedings of ICCAD 2003, pp. 900-907, 2003.

H. Mangassarian, M. Anis, "On Statistical Timing Analysis with Inter-and Intra-die Variations", Proceedings of the Design, Automation and Test in Europe Conference and Exhibition (Date '05), pp. 132-137, Munich, Germany, Mar. 7-11, 2005.

K. Homma, I. Nitta, T. Shibuya, "Non-Gaussian Statistical Timing Models of Dieto-Die and Within-Die Parameter Variations for Full Chip Analysis", Proceedings of ASP-DAC 2008, pp. 292-297, 2008.

S. Sundareswaran, et al, "Characterization of Standard Cells for Intra-Cell Mismatch Variations", Proceedings of the 9th International Symposium on Quality Electronic Design, Washington, DC, International Symposium on Quality Electronic Design, IEEE Computer Society, Mar. 17-19, 2008.

Xiaoping Du, Dr Wei Chen, "A Most Probable Point Based Method for Uncertainty Analysis", Proceedings of DETC00, ASME 2000 Design Engineering Technical Conferences, Sep. 10-13, 2000.

Xiaoping Du, Dr Wei Chen, "A Most Probable Point Based Method for Uncertainty Analysis", unknown date.

* cited by examiner

STATISTICAL STATIC TIMING ANALYSIS IN NON-LINEAR REGIONS

CLAIM OF PRIORITY UNDER 35 U.S.C. 119(e)

The present application claims priority to and incorporates by reference U.S. Provisional Application No. 61/175,853, filed May 6, 2009, entitled "A Computationally Efficient Algorithm For Performing Accurate, Path-Based SSTA In The Regime Where Cell Delay Is Highly Non-Linear In The Underlying Random Variables, And The Probability Density Of The Delay Is Non-Gaussian."

FIELD OF THE INVENTION

This invention relates to simulation of integrated circuits, and, in particular, to simulation of low voltage circuits in which the Probability Density Function (PDF) of the stochastic gate delay is non-Gaussian

BACKGROUND OF THE INVENTION

A timing Path (TP) is a serial connection of logic elements or cells. An input is made to the TP, and the computation is made as the signal propagates through the TP. The TP delay is of interest in designing a chip: This determines the speed of the chip. The TP delay is the sum of cell delays. Traditional static timing analysis (STA) is, and has been, the method that virtually every digital design team uses to achieve timing signoff. In STA, a timing model is required for every cell in the design, or at least for the signal paths that are analyzed. The analyzer uses those timing models to calculate delays for all cells in a given path. Those delays, in turn, are summed to determine total path delays.

Statistical static timing analysis (SSTA) was developed to account for process variation by using probability distributions. In current implementations, the parameters that vary are typically gate length, gate width, flat-band voltage, oxide thickness and channel doping. These parameters are assumed to vary from one chip to another (global variation), but, within a die, they are assumed to be constant.

BRIEF DESCRIPTION OF THE DRAWINGS

Particular embodiments in accordance with the invention will now be described, by way of example only, and with reference to the accompanying drawings.

DETAILED DESCRIPTION OF EMBODIMENTS OF THE INVENTION

Figure 1:
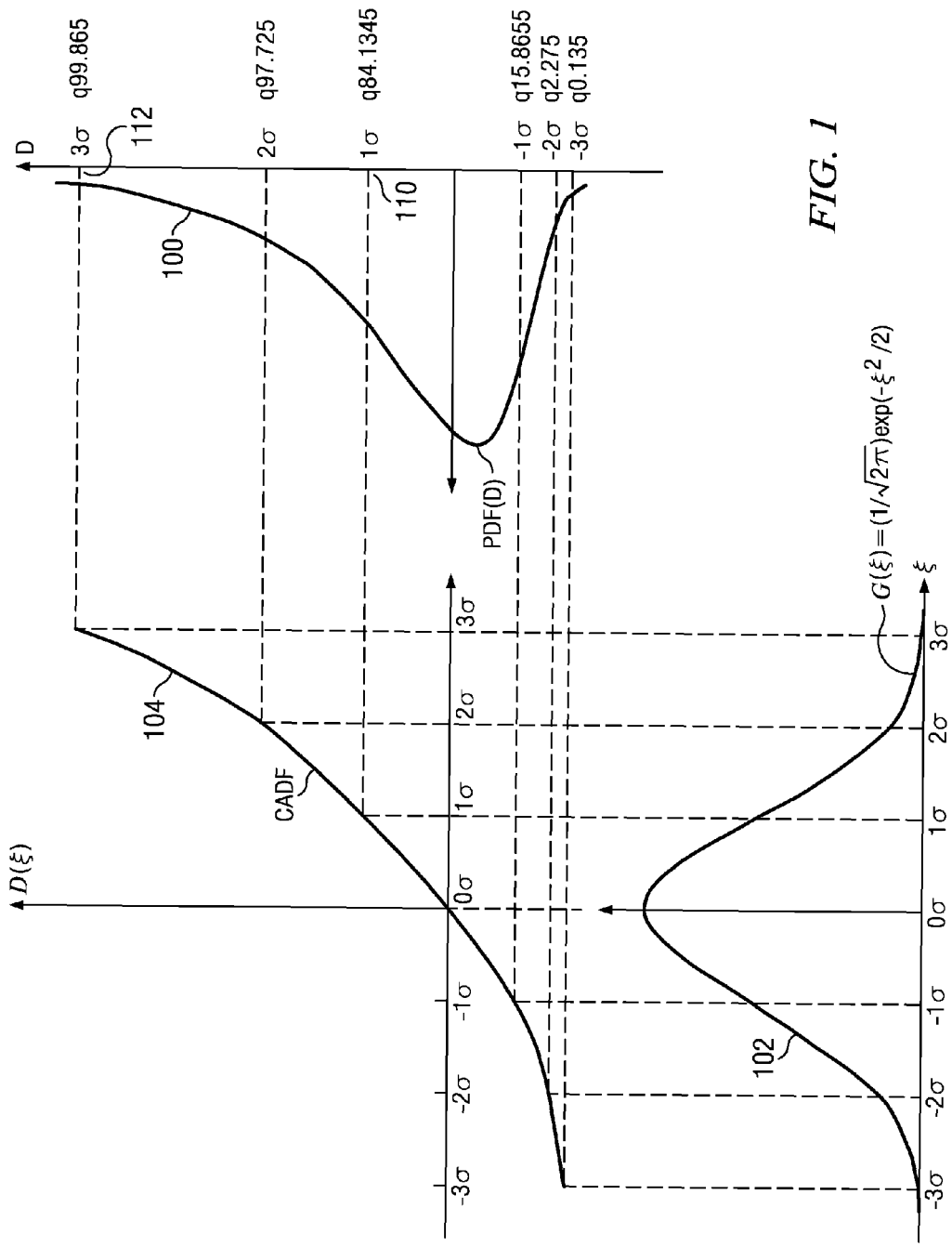
FIG. 1 is a plot illustrating Gaussian mapping of a non-Gaussian Probability Density Fun (PDF) through a Cell-Arc Delay Function (CADF)

For CMOS feature size of 65 nm and below, local (intra-die or within-die) variations in transistor Vt (threshold voltage) contribute stochastic variation in logic delay that is a large percentage of the nominal delay. Moreover, when circuits are operated at low voltage (Vdd≦0.5V), the standard deviation of gate delay becomes comparable to nominal delay, and the Probability Density Function (PDF) of the gate delay is highly non-Gaussian. Existing statistical static timing analysis (SSTA) tools assume a linear Gaussian distribution for delay and thus do not provide acceptable accuracy under a non-linear, non-Gaussian situation, e.g. at very low voltage; therefore, the current static timing analysis (STA) or SSTA tools cannot achieve reasonable timing accuracy at low supply voltage.

This disclosure describes a computationally efficient algorithm for computing any desired point on the Probability Density Function (PDF) of logic Timing Path (TP) delay which results from local transistor variation. This approach will be referred to herein as Non-linear Operating Point Analysis for Local Variations (NLOPALV). The approach may be embodied using commercial STA tools and integrated into the standard CAD flow using custom scripts. Timing paths from a commercial DSP implemented in 28 nm CMOS were analyzed using the proposed technique and the performance is observed to be within 5% accuracy compared to a SPICE based Monte-Carlo analysis.

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that embodiments of the invention may be practiced without these specific details. In other instances, well-known features have not been described in detail to avoid unnecessarily complicating the description.

There are three categories of process variations that are important in design of modern CMOS logic [1]:
1. Global random variation in gate length, gate width, flat-band voltage, oxide thickness and channel doping.
2. Systematic or predictable variations, such as variations in litho or etch or CMP.
3. Local random variations in transistor parameters. Local random variations are assumed to be random from one transistor to another within a die.

For each cell, and for the TP, there is a corner or nominal delay plus a stochastic delay which results from local variations in transistor parameters. In this disclosure, references to delay, D, unless explicitly specified otherwise, mean stochastic delay, and nominal or corner delay must be added to get total delay This disclosure deals with the effect that local variations in CMOS transistor parameters have on logic timing at low voltage, in the range of Vdd≈0.5V. Local variations are primarily the result of variations in the number of dopant atoms in the channel of CMOS transistors [2, 3]. Local variations have long been known in analog design and in SRAM design. In analog design, local variations are called "mismatch" because of the mismatch in the Vt of adjacent transistors. But they have not generally been a problem for logic. However, shrinking of transistor geometries and low voltage design, for ultra-low power applications, make local variations increasingly important for logic.

Some approaches for handling local or intra-die variations have been previously proposed [4-8]; however, this disclosure goes beyond previous work in several important ways. At Vdd≈0.5V, circuit delay is highly non-linear in Vt variation. The result is that the PDF of the delay is highly non-Gaussian. As shown later in this disclosure, the Gaussian assumption results in substantial error at Vdd≈0.5V. This approach deals only with local variations and needs to be used in conjunction with conventional approaches to generate global fast and slow corners.

The effect of local variations is very different from the effect of Global variations. Whereas global variations in delay add linearly, local variations do not. It is well-known in statistics that the PDF of a sum of statistically independent random variables is the convolution of the PDFs of the random variables. In the case when the random variables are Gaussian, convolution gives the well-known result that the PDF of the sum is Gaussian with standard deviation equal to the square root of the sum of the squares of the sigmas of the random variables $$\sigma_{sum} = \sqrt{\sum_i \sigma_i^2}$$

where σi are the standard deviations of the random variables being summed.

In general, however, when the random variables are not Gaussian, there is no simple expression for the PDF of the sum.

Figure 14:
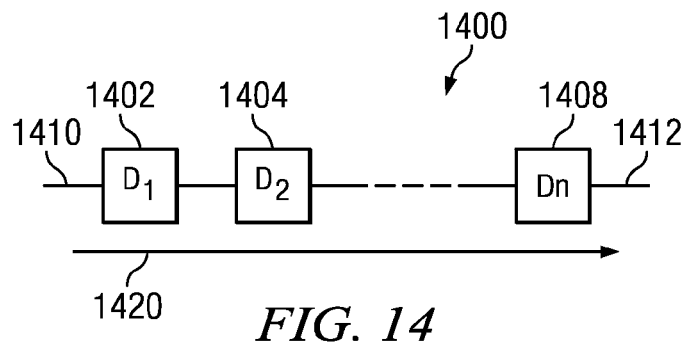
FIG. 14 is a schematic diagram of an exemplary timing path of an exemplary integrated circuit.

FIG. 14 is a schematic diagram of an exemplary timing path 1400 of an exemplary integrated circuit. This exemplary TP includes several cells (1402, 1404, . . . 1408) that each induce a propagation delay ($D_1$, $D_2$, . . . $D_n$) in a signal that is applied to an input of the respective cell. Each cell includes a number of individual transistors that are interconnected in various manners to create a particular logic function. These cells may be the same type cell from a design library, for example, or they may be different type cells from the design library. The total TP delay 1420 from a signal 1410 applied to an input of the first cell 1402 until a corresponding output signal 1412 is produced by the last cell 1408 in the path is the sum of the constituent cell delays, which in turn is a sum of statistically independent random variables, $D_i$. The cell delays are not completely statistically independent, as there is a correlation among the cells. The correlation among cell delay results from the fact that the output slew from one stage is the input slew of the following stage. However, an "input slew correction" can be made such that TP delay is a linear sum of statistically independent random variables. In this disclosure, a concept of "operating point" is employed, which has the advantage that the stochastic delay of a TP can be computed by combining the operating point delays of the respective cells.

FIG. 1 is a plot illustrating Gaussian mapping of a non-Gaussian Probability Density Fun (PDF) through a Cell-Arc Delay Function (CADF), which is described in more detail in the section labeled "cell characterization". In general, any non-Gaussian PDF can be mapped onto a unit variance Gaussian through the Cell-Arc Delay Function $D(\xi)$ as shown in FIG. 1. Once $D(\xi)$ is known, the PDF of the random variable D is known. In the special case when the PDF of D is Gaussian with standard deviation a, $D(\xi)$ takes the simple form $$D(\xi)=\sigma\xi.$$

Explanation of the NLOPALV Technique

Consider a TP consisting of N statistically independent cells. The stochastic delay of each cell, $D_i$, has a PDF: $P_i(D_i)$, that is, in general non-Gaussian. $P_i(D_i)$ is determined for the condition of fixed input slew.

The TP delay $D^{TP}$, is, in general a non-linear function of the cell delays $D_i$ $$D^{TP}(D_1, D_2 \ldots D_N).$$

Under some conditions, TP delay is the sum of cell delays. However, when the input slew from cell i-1 affects the delay of the $i^{th}$ cell, an input slew correction must be added. When this is done, TP delay becomes a more complicated (and, in general non-linear) function of the $D_i$.

The goal of the NLOPALV technique is to determine the f-sigma delay $D_{f\sigma}^{TP}$ of the TP, where f is typically f~3 or f~-3.

In the N-dimensional space of the $D_i$, there is a hyper-surface defined by equation (1).

$$D^{TP}(D_1, D_2 \ldots D_N) = D_{f\sigma}^{TP} \quad (1)$$

Figure 15:
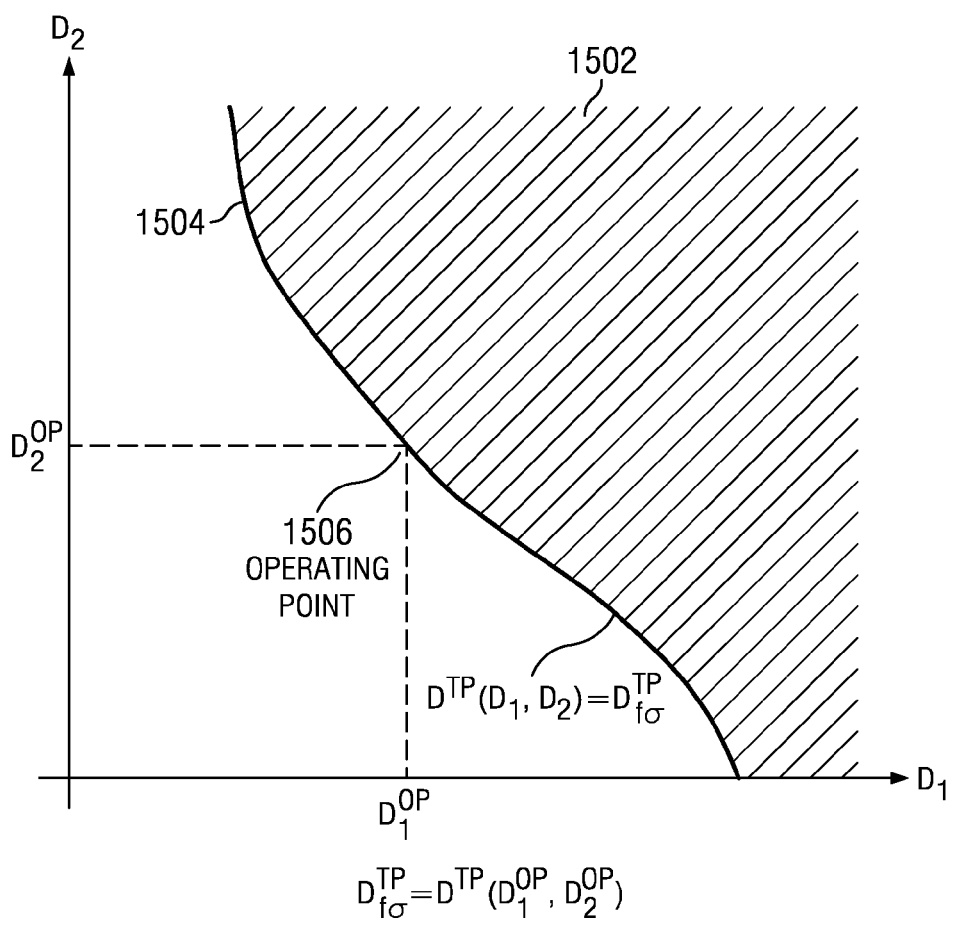
FIG. 15 is an illustration of an N-dimensional space of cell delays for N=2.

This is illustrated for N=2 in FIG. 15. The integral of the joint PDF of $D_1$ & $D_2$ over the cross hatched area 1502 equals 0.00135 for the case f=3. Other values of f can be similarly calculated.

The curve 1504 of $$D^{TP}(D_1, D_2) = D_{f\sigma}^{TP}$$

defines the pairs of delay $D_1$ & $D_2$ such that the equation $$D^{TP}(D_1, D_2) = D_{f\sigma}^{TP}$$

is satisfied. Along this curve, the joint probability of $D_1$ & $D_2$ varies. The point where this joint probability $D_1$ & $D_2$ is a maximum is called the Operating Point. Operating point 1506 is illustrated in FIG. 15.

Determining the Operating Point allows the f-sigma delay to be computed according to equation (2)

$$D_{f\sigma}^{TP} = D^{TP}(D_1^{OP}, D_2^{OP} \ldots D_N^{OP}) \quad (2)$$

In the special case where $$D^{TP}(D_1, D_2 \ldots D_N) = \sum_i D_i$$

then, the f-sigma TP delay can be evaluated by $$D_{f\sigma}^{TP} = \sum_i D_i^{OP}$$

The NPOPALV is based upon two approximations: 1) the function $D^{TP}(D_1, D_2 \ldots D_N)$ is linearized about the operating point and 2) the PDFs of $D_i$ are approximated by appropriate Gaussian PDFs in the vicinity of the operating point. Once these two approximations are made, the operating point can be calculated using Linear-Gaussian theory.

In order to implement the NLOPALV, the random variables $D_i$ are mapped onto the synthetic parameters $\xi_i$, through the function $D(\xi_i)$ as shown in FIG. 1.

$$P_D(D) = \frac{G[I(D)]}{dD/d\xi}$$

where $I(D)$ is the inverse of the function $D(\xi)$.

In $\xi_i$-space, the Operating Point is determined by equation (3).

$$\xi_i^{OP} = \frac{f\alpha_i^{OP}}{\sqrt{\sum_j (\alpha_j^{op})^2}} \qquad (3)$$

where $$\alpha_i^{OP} = \left(\frac{dD^{TP}}{dD_i}\right)_{OP} \left(\frac{dD_i}{d\xi_i}\right)_{OP}$$

The first term represents a linearization of the function $D^{TP}$ with respect to $D_i$. In the special case where $$D^{TP}(D_1, D_2 \ldots D_N) = \sum_i D_i,$$

the derivative $$\left(\frac{dD^{TP}}{dD_i}\right)_{OP} = 1.$$

The second term is the effective sigma that gives the best Gaussian fit to the PDF in the vicinity of the operating point. In the special case when the PDF of $D_i$ is Gaussian with standard deviation $\sigma_i$, $$\left(\frac{dD_i}{d\xi_i}\right)_{OP} = \sigma_i.$$

Figure 16:
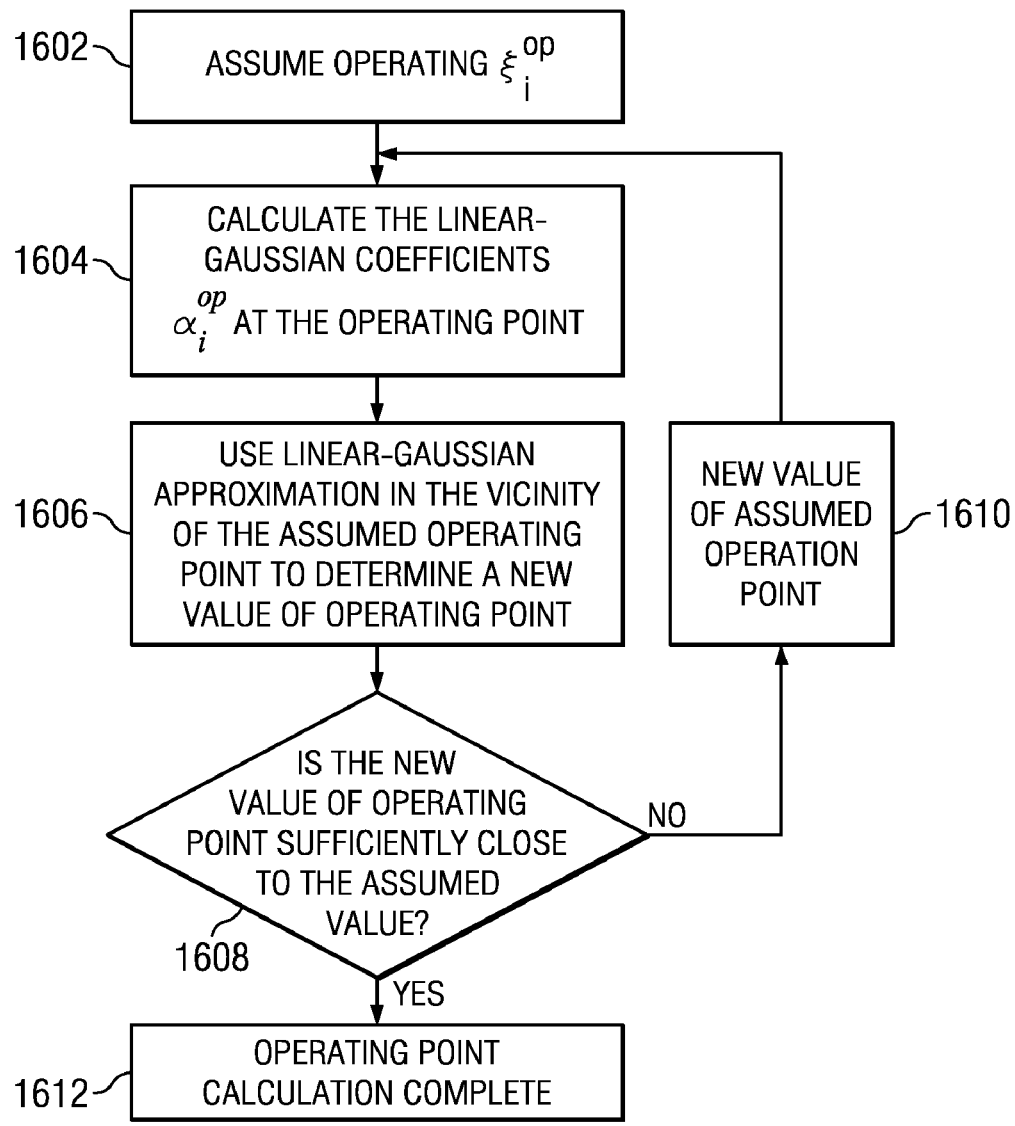
FIG. 16 is a flow chart illustrating calculation of an operating point in a self-consistent manner.

FIG. 16 is a flow chart illustrating calculation of an operating point in a self-consistent manner. An initial operating point $\xi_i^{OP}$ is assumed 1602. At that operating point, the Linear-Gaussian coefficients are computed 1604 according to equation (4).

$$\alpha_i^{OP} = \left(\frac{dD^{TP}}{dD_i}\right)_{OP} \left(\frac{dD_i}{d\xi_i}\right)_{OP} \qquad (4)$$

The resulting Linear-Gaussian Approximation in the vicinity of the assumed Operating Point is then used 1606 to determine a new value of the Operating Point according to equation (5)

$$\xi_i^{OP} = \frac{f\alpha_i^{OP}}{\sqrt{\sum_j (\alpha_j^{op})^2}} \qquad (5)$$

If the new value of the Operating Point is sufficiently close to the assumed value 1608, the Operating Point calculation has converged 1612. If the new value of Operating Point is not sufficiently close, it is necessary to repeat the calculation 1604 of the Linear-Gaussian coefficients at the newly calculated Operating Point 1610.

Once the f-sigma operating point is determined, the f-sigma TP delay is given by equation (6).

$$D_{f\sigma}^{TP} = D^{TP}(\xi_1^{OP}, \xi_2^{OP} \ldots \xi_N^{OP}) \qquad (6)$$

The NLOPALV framework has been described above for the calculation of f-sigma TP delay for a TP made up of individual cells. But the technique is quite general, and it can be applied to cell characterization. In the cell characterization case, the PDFs of the transistor random variables are generally Gaussian, but cell delay is a non-linear function of the transistor random variables. NLOPALV can be used to determine the $\xi$-sigma cell delay for a variety of values of $\xi$, thereby generating the CADF, $D(\xi)$ for the cell.

Cell Characterization

The first step in calculating the effect of local variations on logic timing is the characterization of standard logic cells for local variation. Characterization needs to be done for each arc for each cell. An arc is defined by: 1) input rise or fall; 2) output load capacitance; and 3) input slew. The delay of a cell depends critically on all of these parameters. Characterization of a cell requires characterization over the entire range of input slews and output capacitances for input rise and input fall. Generally, a cell is characterized at 3-4 values of input slew and 3-4 values of output capacitance, and interpolation is used for values of input slew and output capacitance between the characterized values. At characterization, a Cell-Arc Delay Function (CADF), $D(\xi)$, is generated for each arc of each cell.

Characterization needs to be done for each global corner of importance. The timing corner typically bounds the timing behavior in context of potential variations of process variations, temperature and voltage. For each cell, a set of curves is determined and stored for later use. Typically, the set of curves for a given cell may include approximately twenty curves. This initial characterization may be done using Monte-Carlo techniques based on measured transistor data for a selected CMOS process for the transistors that are included within the cell, or it may be done using NLOPALV as shown in subsequent paragraphs.

NLOPALV methods may also be used to efficiently model the local transistor variation at a cell level, rather than using Monte-Carlo techniques. In this case, a cell is characterized by performing the following operations. First, define the normalized random variable $\zeta_i = x_i/\sigma_i$. Then, perform sensitivity analysis of all the local variables to determine the impact of all local variables on the timing response of the timing using equation (7).

$$\alpha_i = \frac{\delta D}{\delta x_i}\sigma_i = \frac{\delta D}{\delta \zeta_i} \qquad \text{eq (7)}$$

where $x_i$ are transistor random variables and $\sigma_i$ is the standard deviation of the random variable $x_i$, and D is stochastic delay of an Arc-Cell.

Local variables that have negligible effect on D may then be eliminated. An operating point (OP) is then obtained at multiple values of $\xi$: $-3 < \xi < +3$, using equation (8).

$$\zeta_i^{op}(\xi) = \frac{\xi \alpha_i}{\sqrt{\sum_j \alpha_j^2}} \qquad \text{eq (8)}$$

At each operating point, new values of αi are calculated and new values of $\zeta_i^{OP}(\xi)$ are calculated by repeating equation (8).

At each operating point, the delay & corresponding output slew are calculated. The resulting Cell Arc Delay Function (CADF) D(ξ) and Slew Arc Delay Function (SADF) S(ξ) constitute the output of cell characterization for Local Variables.

Multi-Stage Logic Path SSTA Analysis

Referring again to FIG. 1, the analysis of a multicell timing path starts with pre-characterized logic cells. For every arc of every cell (every arc-cell) there exists a PDF of the delay. Referring to FIG. 1, it is clear that any arbitrary PDF 100 can be mapped onto a unit variance Gaussian distribution 102 through the Cell-Arc Delay Function (CADF) D(ξ) 104. In general, for this analysis, the PDF will be non-Gaussian. Characterization also provides the Cell-Arc Slew Function (CASF) S(ξ), which is the most probable output slew for each value of ξ. The computational efficiency of the NLOPALV approach results from the fact that the entire PDF of the TP is not usually required. In TP analysis, the area of interest is generally the f-sigma delay where f~+3 for setup time and f~−3 for hold time.

The goal of multi-stage SSTA is to determine the 3-sigma TP delay (or in general the f-sigma TP delay) without incurring the computational expense of computing the entire PDF of the TP delay. In general, the PDFs of the logic cell delays are highly non-Gaussian. However, even in the non-Gaussian case, the concept of f-sigma delay has meaning. As shown in FIG. 1, the 1-sigma point 110 is the 84.1345% quartile, the 3-sigma point 112 is the 99.8650% quartile etc. However, in the non-Gaussian case, the a defined by quartile is unrelated to the standard deviation of the non-Gaussian variable. Using the NLPOALV approach, the f-sigma TP delay is approximated by a linear sum of f-sigma operating point delays for the individual logic cells. This is done without the need for Monte-Carlo simulations or additional SPICE simulations.

The concept of operating point is important in the NLO-PALV approach. The Operating Point in $\xi_i$-space is the point where the integrand of the convolution integral is maximum. This is the same as saying that the joint probability density of the $D_i$ is a maximum. This is important because the value of the convolution integral is determined mostly by the values of $\xi_i$ in the immediate vicinity of the Operating Point. The NLO-PALV approach makes the assumption that TP delay $D^{TP}$ is approximately linear in $\xi_i$ in the immediate vicinity of the Operating Point.

$$D^{TP}(\xi_1, \xi_2 \ldots \xi_N) \approx D_{OP}^{TP} + \sum_i \left(\frac{dD_i}{d\xi_i}\right)_{OP} (\xi_i - \xi_i^{OP})$$

Within the validity of this assumption, the f-sigma operating point is the point of tangency of the hyper-plane $D^{TP}(\xi_i) = D_{f\sigma}^{TP}$ with the hyper-sphere of radius f.

Single Logic Path

Starting with a timing path of N logic cells, each of which is characterized by CADF $D_i(\xi_i)$, the f-sigma TP delay may be determined. For simplicity, assume that the stochastic delays $D_i$ are statistically independent. It will be seen below that this simplifying assumption is not true, but this complication will be addressed later. The f-sigma operating point may be defined as shown in equation (9).

$$\xi_i^{OP} = \frac{f\alpha_i^{OP}}{\sqrt{\sum_{j=1}^{N} (\alpha_j^{op})^2}}; \quad (9)$$

where $$\alpha_i^{op} = \left(\frac{dD_i}{d\xi_i}\right)_{op}$$

Equation (9) needs to be solved iteratively, but once the operating point of the TP is determined, the f-sigma timing path delay may be approximated as a linear sum of f-sigma operating point delays of the constituent logic cells, as shown in equation (10).

$$D_{f\sigma}^{TP} \approx \sum_i D_i(\xi_i^{OP}) \quad (10)$$

Figure 2:
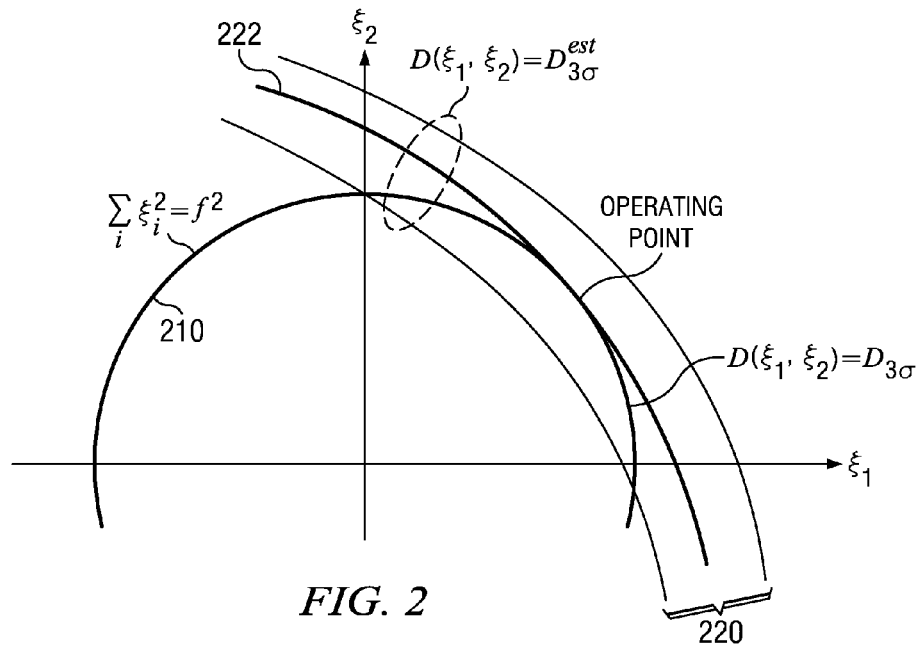
FIG. 2 is a plot illustrating a multi-stage operating point.

FIG. 2 is a plot illustrating a multi-stage operating point. To graphically illustrate this concept, consider the following. At the operating point 200, $$D^{TP}(\xi_1, \xi_2 \ldots \xi_N) = D_{f\sigma}^{TP}.$$

Furthermore, the operating point lies on the hyper-sphere 210, where $$\sum_i \xi_i^2 = f^2.$$

From this, it follows that the operating point results from the simultaneous solution of the above equations. Considering $D_{f\sigma}^{est}$ as initial estimates of $D_{f\sigma}$, a family of curves 220 may be determined. The Operating Point is the point of tangency of the curve 222

$$D^{TP}(\xi_1, \xi_2 \ldots \xi_N) = D_{f\sigma}^{est}$$

with the hyper-sphere 210

$$\sum_i \xi_i^2 = f^2$$

and the value of $D_{f\sigma}^{est}$ that defines the curve is the desired value of $D_{f\sigma}$.

In the 2-stage case, making linear approximation in the region near the operating point, the operating point may be determined as the point of tangency of the line $$\alpha_1 \xi_1 + \alpha_2 \xi_2 = D_{f\sigma}$$

with the circle $$\xi_1^2 + \xi_2^2 = f^2.$$

The operating point can thus be given as defined by equations (11).

$$\xi_1^{op} = \frac{f\alpha_1}{\sqrt{\alpha_1^2 + \alpha_2^2}} \text{ and } \xi_2^{op} = \frac{f\alpha_2}{\sqrt{\alpha_1^2 + \alpha_2^2}} \quad (11)$$

This analysis can be easily extended to N stage timing path where the operating point is given by equation (9).

However, in real timing paths, the stage delays $D_i$ are not statistically independent. The stochastic delays of adjacent stages are correlated since the output slew of one stage is the input slew of the next stage. In fact, the total stochastic delay of cell i depends on the delay of the previous cells i-1 and i-2. This is true because the delay of cell i depends on the input slew, which depends on the delay of cell i-1. Similarly, the delay of cell i-1 depends on the delay of cell i-2. So, in principal, the delay of cell i depends on the delays of all previous cells. Accounting for the dependence on the delay of the previous two cells typically provides adequate accuracy.

Note that, when input slew correction is considered, there are still only N statistically independent random variables $D_i$, where N is the number of cells in a TP. And there are only N synthetic parameters $\xi_i$. But now, the cell delay in $\xi i$-space is given by the hyper-plane $$D^{TP}(\xi_1, \xi_2 \ldots \xi_N) \approx D_{OP}^{TP} + \sum_i (\alpha_i + \eta_i + \lambda_i)(\xi_i - \xi_i^{OP})$$

where $\xi_i^{OP}$=f-sigma Operating Point $$\alpha_i = \left(\frac{dD_i}{d\xi_i}\right)_{OP} \quad (12)$$

$$\eta_i = \left(\frac{dD_{i+1}}{d\xi_i}\right)_{OP} = \left(\frac{dD_{i+1}}{dS_i}\right)_{OP}\left(\frac{dS_i}{d\xi_i}\right)_{OP} \quad (13)$$

$$\lambda_i = \left(\frac{dD_{i+2}}{d\xi_i}\right)_{OP} = \left(\frac{dD_{i+2}}{dS_{i+1}}\right)_{OP}\left(\frac{dS_{i+1}}{dS_i}\right)_{OP}\left(\frac{dS_i}{d\xi_i}\right)_{OP} \quad (14)$$

where $S_i$ is the output slew for the $i^{th}$ cell

The f-sigma OP is now given by the following expression $$\xi_i^{OP} = \frac{f(\alpha_i + \eta_i + \lambda_i)}{\sqrt{\sum_j (\alpha_j + \eta_j + \lambda_j)^2}} \quad (15)$$

Algorithm for Non-Linear Operating Point Analysis for Local Variations (NLOPALV)

This approach leads to an iterative algorithm for determining the operating point and thereon computing $D_{f\sigma}^{TP}$ that can be summarized as follows. Prior to analyzing a design, all cells in the design are characterized to create a cell library for each cell. For each arc of each cell, determine the Cell-Arc Delay Function (CADF) $D_i(\xi_i)$ and the Cell-Arc Slew Function (CASF) $S_i(\xi_i)$. The cell library includes cell instances corresponding to each characterization point $\alpha_i$.

Once a design has been created, the nominal delays $D_i^{nom}$ for each stage in the timing path are taken from the cell characterization data. An initial estimate of the operating point is determined using equation (16).

$$\xi_i^{OP} = \frac{fD_i^{nom}}{\sqrt{\sum_i (D_i^{nom})^2}} \quad (16)$$

Then calculate a first estimate of $\alpha_i$, $\eta_i$, and $\lambda_i$ from the equations 12, 13, and 14. Using the above OP values of $\alpha_i$, $\eta_i$, and $\lambda_i$, compute a new estimate of the f-sigma OP using the equation 15.

Once the operating point has been determined, then the f-sigma TP delay can be determined using equations 17, 18 and 19.

$$D_{f\sigma}^{TP} = \sum_{i=1}^{N} D_i(\xi_i^{OP}) + \sum_{i=1}^{N-1} D_{i+1,i}(\xi_i^{OP}) + \sum_{i=1}^{N-2} D_{i+2,i}(\xi_i^{OP}) \quad (17)$$

where $$D_{i+1,i}(\xi_i^{OP}) = \left(\frac{dD_{i+1}}{dS_i}\right)_{OP} S_i(\xi_i^{OP}) \quad (18)$$

$$D_{i+2,i}(\xi_{iOP}) = \left(\frac{dD_{i+2}}{dS_{i+1}}\right)_{OP}\left(\frac{dS_{i+1}}{dS_i}\right)_{OP} S(\xi_i^{OP}) \quad (19)$$

This is the result of the NLOPALV applied to TP analysis A simple iterative computation produces an estimated timing path delay for non-Gaussian cell delays that has accuracy similar to that of a full Monte Carlo analysis. Monte Carlo analysis is capable of giving an "exact" result if sufficient Monte Carlo points are computed, but the computational cost of making the Monte Carlo calculation is prohibitive.

The input slew correction technique described here is useful for Gaussian as well as non-Gaussian PDF. Of course, the entire NLOPALV technique is valid for Gaussian as well as non-Gaussian statistics.

Integration with the CAD Flow

Figure 3:
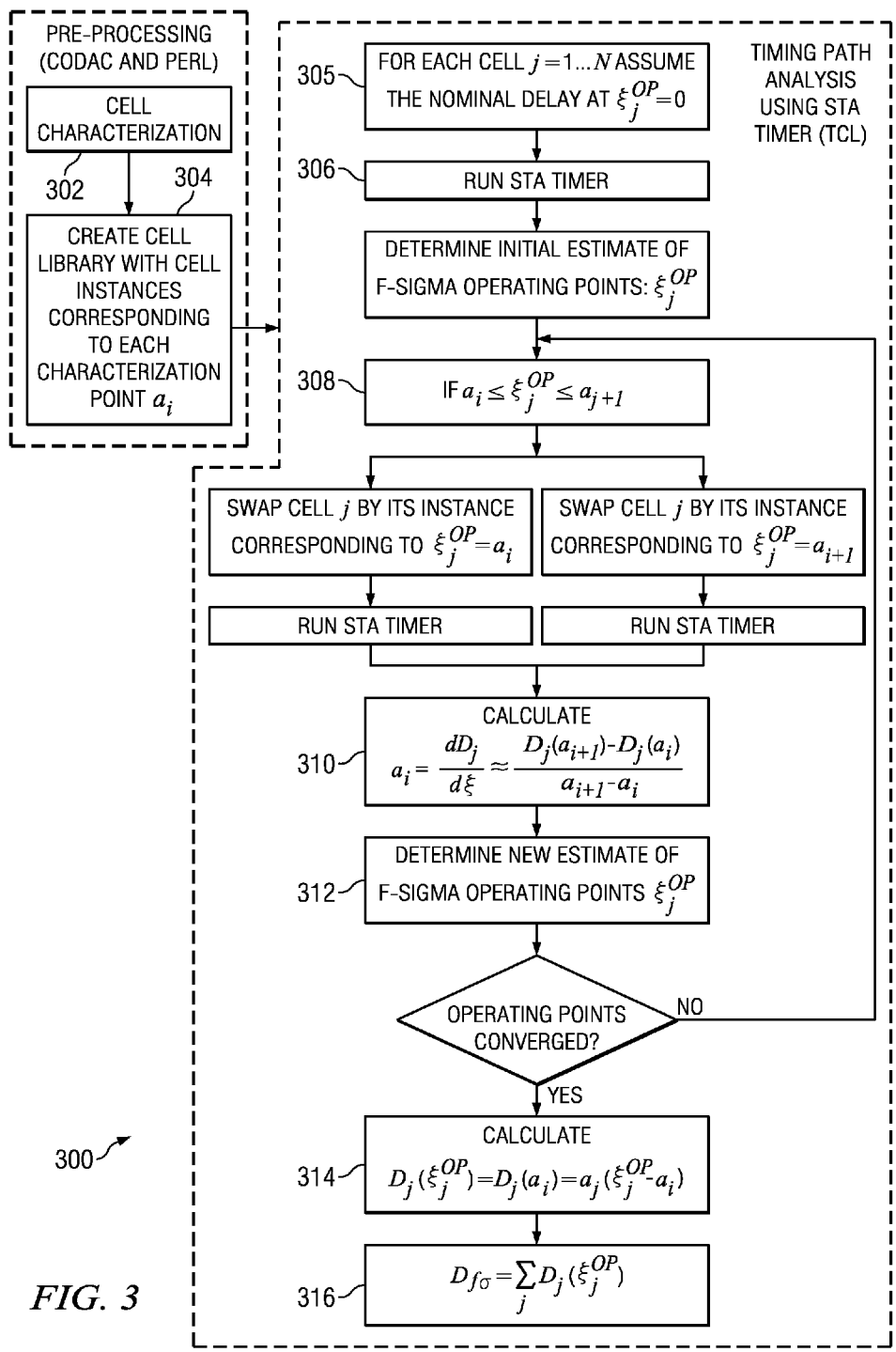
FIG. 3 is a flow chart illustrating CAD (computer aided design) flow for logic path Non-linear Operating Point Analysis for Local Variations (NLOPALV) analysis.

FIG. 3 is a flow chart illustrating CAD (computer added design) flow 300 for Logic Path NLOPALV analysis. While performing timing analysis of any design using STA, there are two types of timing analysis. One is done at an early design level which is often also referred to as Graph based analysis (GBA). The timing tool would perform gross estimate of the design performance. This analysis is typically pessimistic but is very fast. The other method of timing analysis is called the path based analysis (PBA). PBA would perform detailed path specific analysis using accurate slew propagation to obtain accurate timing performance of each path. PBA is usually time and compute intensive. That is why PBA is performed towards the end of design cycle as a final sign-off check.

For the purposes of simplicity, FIG. 3 and the accompanying explanation ignore the input slew correction. The input slew correction can be incorporated into the flow by adding calculations of $\eta_i$ and $\lambda_i$ in box 310 and using them in the calculation of operating points in box 312. In order to effectively use SSTA in the design process, it is important to integrate the NLOPALV algorithm with an existing CAD flow. The NLOPALV algorithm presented above is integrated with a commercial STA Timer. In one embodiment, the standard STA tool is Primetime, which is available from Synopsis, Inc. The NLOPALV non-linear SSTA algorithm described above is implemented using Tcl script and available STA commands inside the Primetime tool to obtain a desired statistical delay, such as 3 sigma delay of the timing path.

As described above, prior to a CAD session, each cell that will be used in the design is characterized 302. Generally, a cell is characterized for input rise and input fall at 3-4 values of input slew and 3-4 values of output capacitance, and interpolation is used for values of input slew and output capacitance between the characterized values. At characterization, a Cell-Arc Delay Function (CADF), $D(\xi)$, and a Cell-Arc Slew Function (CASF), $S(\xi)$, as described in more detail above, are generated for each arc (input rise/fall, input slew and output capacitance) of each cell.

A cell library is created 304 with cell characterization done at a range of the synthetic parameter $\xi=\alpha_j$ as described in more detail above.

A design is then created 305 in a normal, known manner. Various known design tools may be used to create a circuit design. Once a design is created, then an initial timing run is performed 306 using the timing simulation tool. Once a design has been created, the nominal delays $D_i^{nom}$ for each stage in the timing path are taken from the cell characterization data. An initial estimate of the operating point is determined using equation (16). The initial estimates of Operating Point are used in 308 and 310 to calculate new estimates for α, and these are used to obtain a new estimate of f-sigma operating points $\xi_i^{OP}$ in box 312. This process is continued until the values of operating point converge. Typically, convergence occurs in approximately five iterations. Once they have converged, the values of operating point are used in box 314 to compute cell delays (box 314). An f-sigma TP delay (box 316) may be calculated by a simple linear summation of the individual cell delays.

Results

Figure 4:
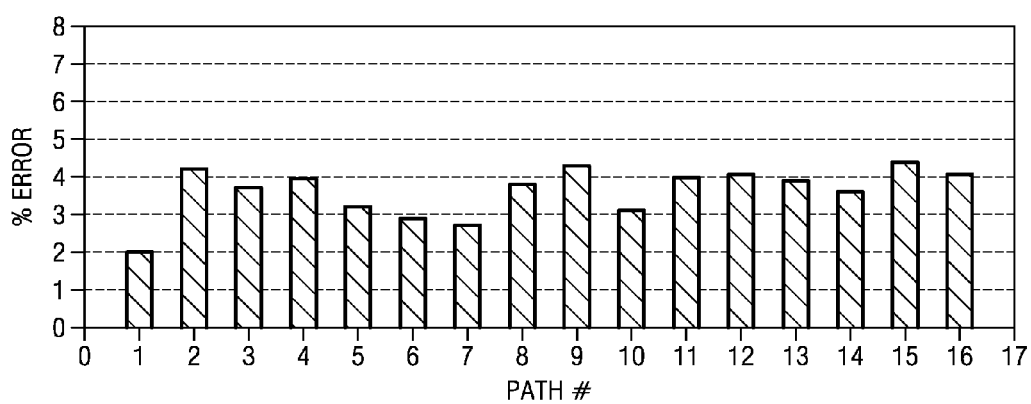
FIG. 4 is a bar chart comparison of simulation performance for NLOPALV vs. Monte-Carlo.

To validate the NLOPALV approach disclosed herein, it was tested on logic paths taken from a commercial Digital Signal Processor (DSP) implemented in 28 nm technology, operating at 0.5V. The NLOPALV algorithm and the corresponding CAD flow to determine 3-sigma delay for the logic timing path were used and the results were compared to results obtained from a SPICE based Monte-Carlo analysis. Monte-Carlo analysis of a timing path is computationally intensive and extremely time consuming, and is therefore generally not practical for use on a complicated design such as the DSP used in this experiment. FIG. 4 shows the comparison results for different timing paths. In this example, sixteen different timing paths were simulated using both types of analysis. Only small discrepancies in the range of 2-4.5% were detected between the two types of analysis, which illustrates that the result of using the computationally efficient NLOPALV algorithm provides results that are nearly as accurate as using the computationally intensive Monte-Carlo analysis.

Figure 5:
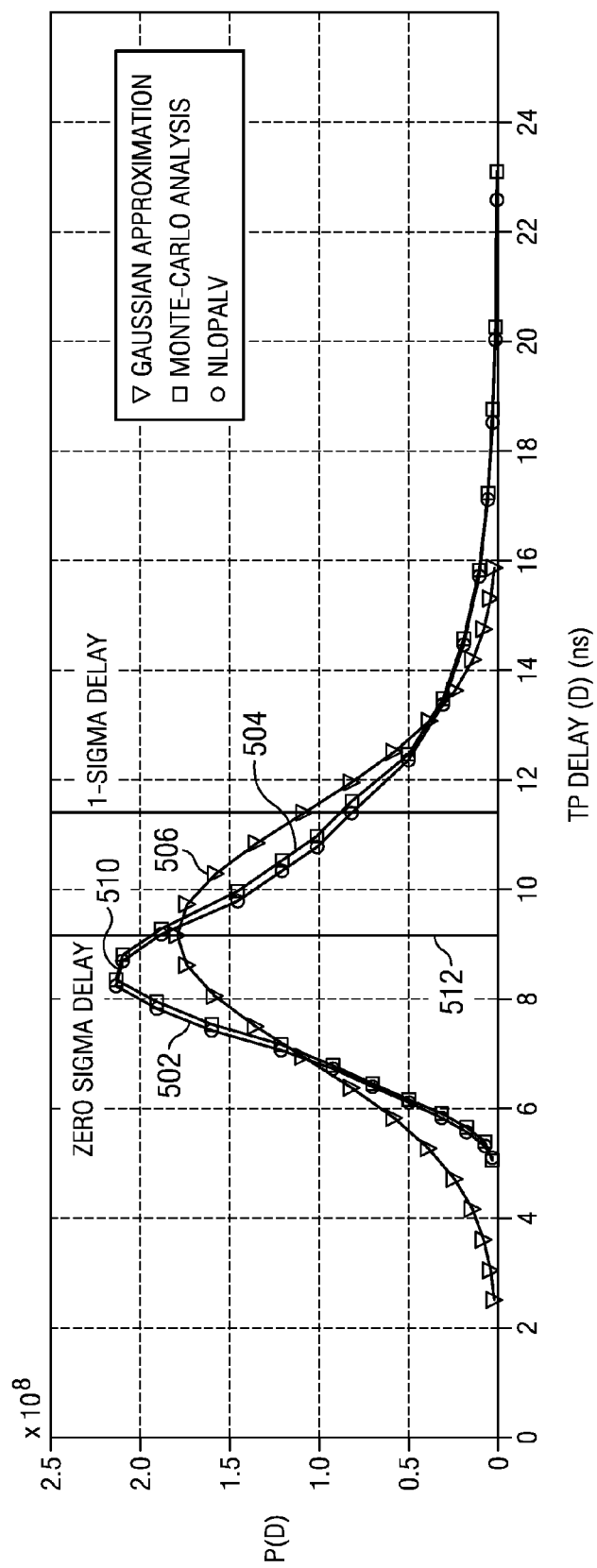
FIG. 5 is a plot illustrating timing path (TP) delay PDF for various algorithms.

FIG. 5 shows comparison between the NLOPALV approach 502 and Monte-Carlo 504 for calculating the PDF of a typical timing path at 0.5V, as compared to a Gaussian analysis 506. It shows excellent agreement between the NLOPALV approach and Monte Carlo and also illustrates the inadequacy of the Gaussian approximation at low voltage. It is informative to note that the PDF of the TP delay peaks at a point in time 510 that is less than the nominal delay 512 (zero-sigma delay). The mean of the non-Gaussian PDF lays 1.6 ns to the right of the nominal delay, whereas in the Gaussian approximation, the stochastic delay has zero mean.

The 3σ stochastic delay is 13.41 ns, compared to a nominal delay of 9.17 ns. This shows that the variation at 0.5V can be much higher than the nominal delay itself.

The 3-sigma stochastic delay calculated using the Gaussian approximation is 8.53 ns compared to the actual 3-sigma stochastic delay of 13.41 ns. This shows that the Gaussian approximation is highly optimistic.

The NLOPALV analysis was performed on different paths of different lengths, taken from the 28 nm Digital Signal Processor. Table 1 summarizes additional results for a few of these paths. The 3-sigma delay (nominal +3σ stochastic delay) computed using NLOPALV shows excellent agreement with Monte-Carlo. This contrasts with the large errors that result when the delay is assumed to be Gaussian.

TABLE 1

Performance comparison of NLOPALV vs. Monte-Carlo and Gaussian approximation.

| TP # | Nominal Delay (ns) | 3-Sigma Stochastic Delay (ns) | | | |
|---|---|---|---|---|---|
| | | NLOPALV | Monte-Carlo | % Error | Gaussian Approx. | % Error |
| 1 | 2.81 | 4.38 | 4.61 | 4.98% | 2.38 | 45.6% |
| 2 | 4.07 | 4.31 | 4.59 | 6.10% | 2.68 | 37.8% |
| 3 | 6.88 | 7.89 | 8.33 | 5.28% | 4.19 | 45.5% |
| 4 | 9.76 | 13.15 | 13.86 | 5.12% | 6.22 | 52.7% |
| 5 | 14.33 | 16.30 | 17.34 | 5.99% | 7.88 | 50.7% |
| 6 | 22.59 | 25.95 | 27.55 | 5.80% | 13.27 | 48.9% |
| 7 | 27.12 | 30.16 | 32.18 | 6.21% | 14.80 | 50.9% |
| 8 | 32.71 | 29.85 | 31.75 | 5.98% | 14.00 | 53.1% |

Timing Path Setup and Hold Analysis

Figure 6:
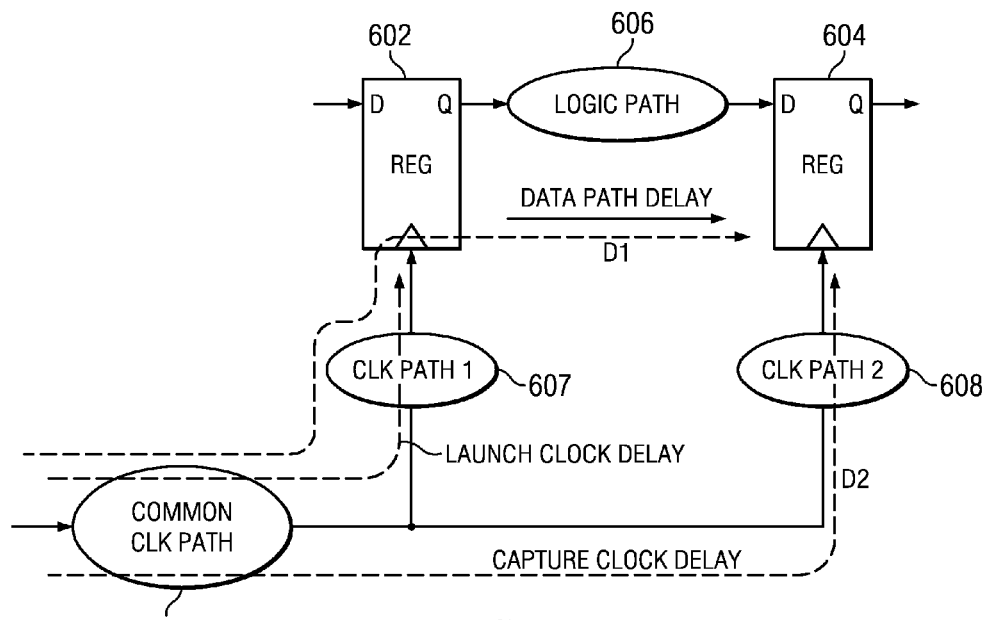
FIG. 6 is a schematic diagram illustrating a typical timing path for setup/hold analysis.

An extension to the NLOPALV approach will now be described to perform setup and hold time analysis on timing paths including clock paths. FIG. 6 is a schematic diagram illustrating typical timing path for setup/hold analysis. This simple example includes two registers 602, 604 that are clocked by a common clock signal CLK. The clock signal propagates through a common path 609 and separate paths 607, 608. An output from register 602 propagates logic path 606 to get to an input on register 604. A delay path $D_1$ and a delay path $D_2$ need to be evaluated for setup and hold time constraints on register 604.

Setup and hold analysis computes setup and hold values which determine the timing margin of the design on particular paths. Slack needs to be above zero to meet timing requirement. The slack for setup is defined as clock period plus capture clock delay subtracted by the sum of launch clock delay and data path delay. The slack for hold is defined as launch clock delay plus data path delay subtracted by capture clock delay. Therefore, a subtraction operation is needed for NLOPALV to obtain slack values in setup and hold analysis.

Consider the hold constraint:

$$D_1 > D_2 + T_{hold}$$

In presence of statistical variations, it must be verified that:

$$(D_1 - D_2)_{-3\sigma} - T_{hold}^{3\sigma} > 0$$

Similarly, the setup constraint as:

$$(D_1 - D_2)_{3\sigma} + T_{setup}^{3\sigma} < T_{CLK}$$

where, $T_{CLK}$ is the clock period for the design.

The PDFs for setup/hold time for registers 602, 604 and other logic path elements are obtained from cell characterization. The NLOPALV approach described above can be used to compute $(D_1-D_2)_{+/-3\sigma}$ operating points for the cells by considering the paths $D_1$ and $D_2$ together and computing the +/−3σ operating point for the cells in both these paths taken together.

In order to determine the f-sigma value of the delay $(D_1-D_2)$, the operating point values of $D_1$ and negative operating point values of $D_2$ are used. During setup and hold analysis, to handle common clock paths, the operating points on cells of common clock path are set to zero. The slew rate from the output of the common path is applied to the following stages for further analysis in NLOPALV.

Thus, the NLOPALV approach can be applied to setup/hold analysis by modifying the polarity of operating points to realize the "subtraction" operation and centering the operating point at zero for cells on the common clock path.

Figure 7:
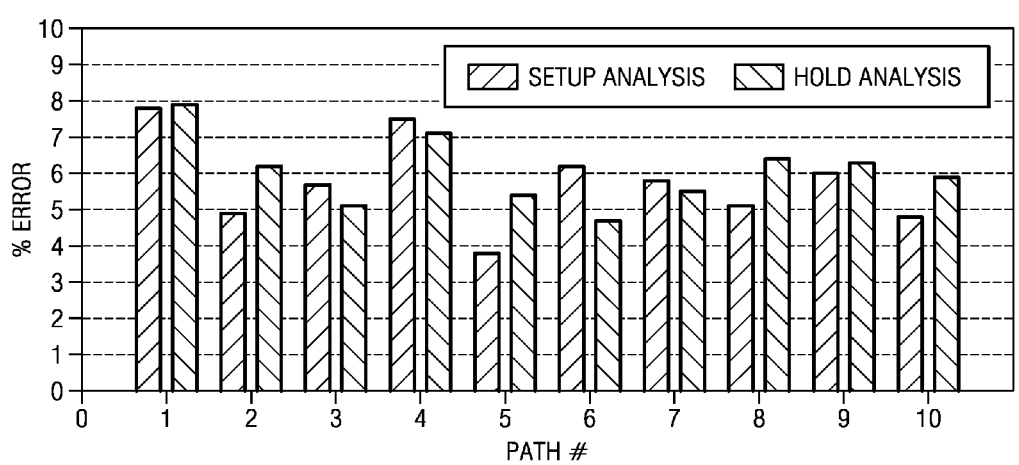
FIG. 7 is a bar chart comparison of simulation performance for Setup/hold analysis: NLOPALV vs. Monte-Carlo.

This approach was verified by considering timing paths along with the corresponding clock paths from the DSP mentioned above. The 3σ setup/hold slack is computed using the NLOPALV approach described above and the results are compared with those obtained from SPICE based Monte-Carlo simulations. Timing paths taken from the same DSP are used and the results are summarized in FIG. 7 in the form of % error. Again, the computationally efficient NLOPALV approach compares very favorably with the computationally intensive Monte-Carlo simulations, with errors in the range of only 3.5-8%.

The NLOPALV computation runs in linear time with respect to number of stages, whereas the Monte-Carlo analysis has exponential run time. In the NLOPALV approach, no expensive Monte-Carlo simulations are required during timing closure. The NLOPALV approach does not assume delay PDF to be Gaussian and can handle the case where delay is a highly non-linear function of random variables with non-Gaussian PDF. The concept of operating point greatly simplifies computations despite non-linearities without sacrificing accuracy. Furthermore, this approach can be extended for optimizing the designs to reduce the stochastic delays.

Progressive Pruning of Timing Paths

Figure 8:
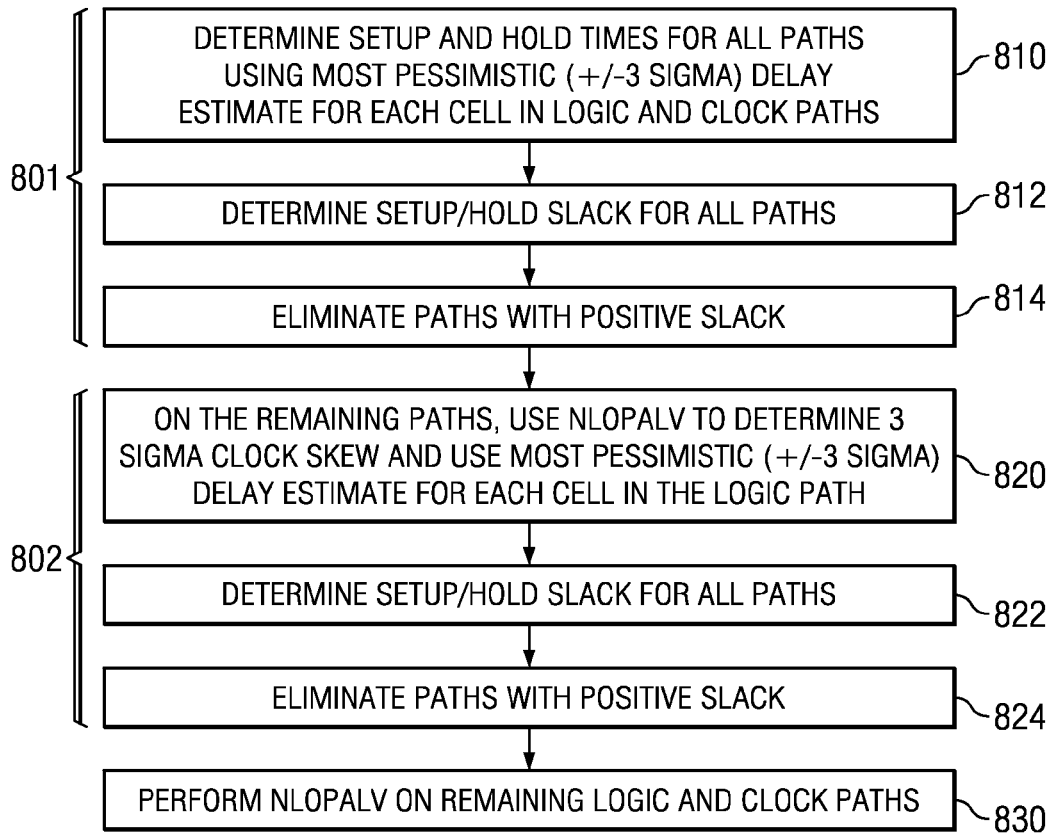
FIG. 8 is a flow chart illustrating progressive pruning of timing paths for NLOPALV analysis.

FIG. 8 is a flow chart illustrating progressive pruning of timing paths for NLOPALV analysis. To reduce the total number of paths for analysis, a two-step progressive pruning methodology is applied by gradually reducing the pessimism on operating point values in analysis so that a large amount of paths can be eliminated from consideration. There are millions of timing paths in a design to be analyzed. However, only very small percentage of the total paths are timing critical. Many currently available timing tools provide capability of performing path-based analysis which is more timing consuming but more accurate. However, because the calculation in prior art tools is deterministic, identifying critical paths is simply a "sorting" function while in NLOPALV, a "progressive" approach is adapted. To reduce the total analysis time, a two-step pruning process is developed based on NLOPALV.

In STEP 1 (801), conventional static timing analysis is done by setting all cells to their most pessimistic operating points: +3 sigma or −3 sigma as described below, and as indicated at 810. The required times for capture clock delay for hold or capture clock delay plus clock period for setup and arrival time for launch clock delay plus data path delay are calculated using pessimistic −3 sigma or +3 sigma delay. For example, for hold analysis, the required time is estimated by setting all cells in the required time path to +3 sigma (operating point equals to +3) and arrival time is estimated by setting all cells in the arrival time path to −3 sigma. The slack is calculated at 812 by subtracting the arrival time from the required time. This is the most pessimistic condition for hold analysis. A similar operation is applied for setup analysis. After that, the paths with positive slack may be eliminated at 814 as they are not critical even under most pessimistic estimation. While +/−3 sigma is suggested here for a pessimistic analysis, a higher or lower number may be used for the pessimistic f-sigma analysis.

In STEP 2 (802), in remaining paths, for each clock launch and capture pair, perform the NLOPALV analysis for the clock skew (difference between capture and launch paths) on the clock path pair only, as indicated at 820. This provides a more accurate timing result on clock paths. Because the number of clock pairs is much smaller than the number of total timing paths, the number of NLOPALV analyses required in this step is much less than the analysis required if NLOPALV is performed on every timing path. The data path delay still uses the pessimistic estimation from STEP 1. The slack values are then updated using more accurate clock path delay and previous data path delay as indicated in 822. We can eliminate the paths with positive slack after this step as they are not critical under our pessimistic estimation in this step, as indicated in 824

After this two-step pruning process, only a single-digit percent of paths usually remain. NLOPALV will be applied on the remaining paths for final timing analysis, as indicated in 830.

Convergent Circuits

When there are convergent paths, a statistical MAX operation can be performed at the node of convergence to further improve the accuracy of the SSTA analysis. A scheme for calculating an accurate statistical delay on convergent paths by introducing a correction on the desired operating points of the paths will now be described.

Figure 9:
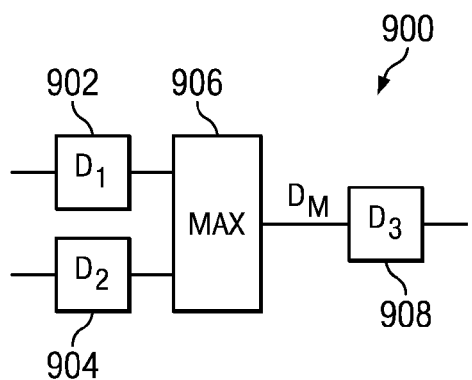
FIG. 9 is a block diagram of an exemplary convergent circuit for which NLOPALV analysis is applicable.

FIG. 9 is a block diagram of an exemplary convergent circuit 900 for which NLOPALV analysis is applicable. To date, the default solution for convergent paths has been handled by calculating the f-sigma delay through each path, and selecting the path that gives the longest delay. When the two paths have very different delay, this is a good approximation. But, when two convergent paths have approximately the same delay, this approximation under-estimates the correct f-sigma delay. A procedure to calculate a more accurate f-sigma delay for convergent paths will now be described.

Referring to FIG. 9, circuit 900 includes two timing paths 902, 904, referred to as $D_1$ & $D_2$, followed by a Max function 906. This is followed by timing path 908 referred to as $D_3$. In the following analysis, g is used to represent the synthetic parameter (ξi) for the TPs $D_1$ & $D_2$. The objective is to accurately compute $D_M(g)$, which is the CADF for the output of the max operation.

Consider the two delay paths $D_1$ & $D_2$ having PDF given by $P_1(D_1)$ and $P_2(D_2)$. If $D_M$ is defined to be $D_M=\max(D_1,D_2)$, the PDF of $D_M$ can be written as $$P_M(D_M)=Pr(D_2 \leq D_M)P_1(D_M)+Pr(D_1 \leq D_M)P_2(D_M)$$

$P_M(D_M)$ out near the 3-sigma tail can be approximated by equation (20).

$$P_M(D_M) \approx P_1(D_M)+P_2(D_M) \quad (20)$$

Equation (20) is a good approximation for $g \geq 1.5$. This approximation is equivalent to replacing the Max operator 906 with an Or operator.

Figure 10:
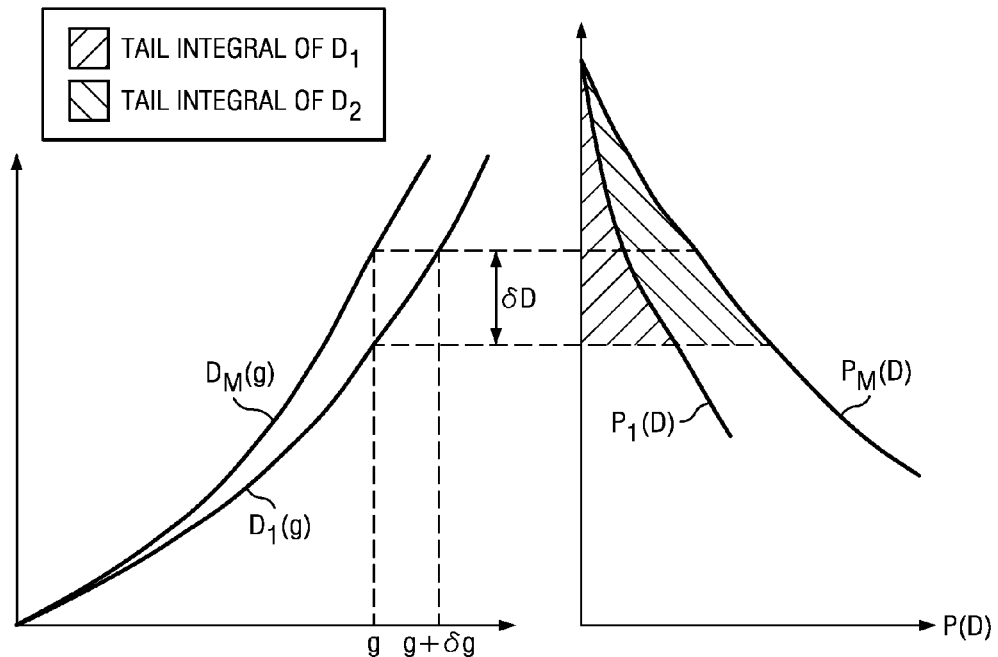
FIG. 10 is a plot illustrating two delay paths where $P_1(D) = P_2(D)$.

FIG. 10 is a plot illustrating two delay paths where $P_1(D)=P_2(D)$. This illustrates the case when $P_1(D)=P_2(D)$, and PM may be represented by equation (21).

$$P_M(D_M) \approx 2P_1(D_M) \quad (21)$$

The g-sigma value of $D_M$ equals the g+δg value of $D_1$, i.e., $D_M(g)=D_1(g+\delta g)$ and δg is obtained from $\phi(g)=2\phi(g+\delta g)$. The PDF of max 906 output is 2× the PDF of either variable. The 3-sigma delays for the two TPs add together to give a tail integral of 0.0027, which is double the 3-sigma error of 0.00135. Thus, the 3-sigma delay of $D_M=\max(D_1, D_2)$ is greater than 3 by some amount δD. It will be shown in the next paragraph that the 3-sigma delay for $D_M$ is equal to the 3.205-sigma delay for $D_1$.

If the Gaussian "tail integral" is defined to be $$\Phi(g) = \int_g^\infty G(\xi)\,d\xi,$$

then the above result can be obtained by substituting g=3 into the equation (22).

$$g+\delta g=\Phi^{-1}\{\Phi(g)/2\} \quad (22)$$

$$\Phi^{-1}\{\Phi(3)/2\}=3.205$$

This means that the 3-sigma delay $D_M$ is not $D_1(g)$ evaluated at g=3. It is $D_1(g)$ evaluated at g=3.205. More generally, the g-sigma delay $D_M$ is $D_1(g)$ evaluated at g+$\delta g$ where the correction $\delta g$ is given by Equation (22) and is tabulated in the table below under the column $\Delta_g$=0. This is an exact solution to the problem of computing $D_M(g)$ where $P_M(D)=2P_1(D)$. It is valid for arbitrary $P_1(D)$.

Figure 11:
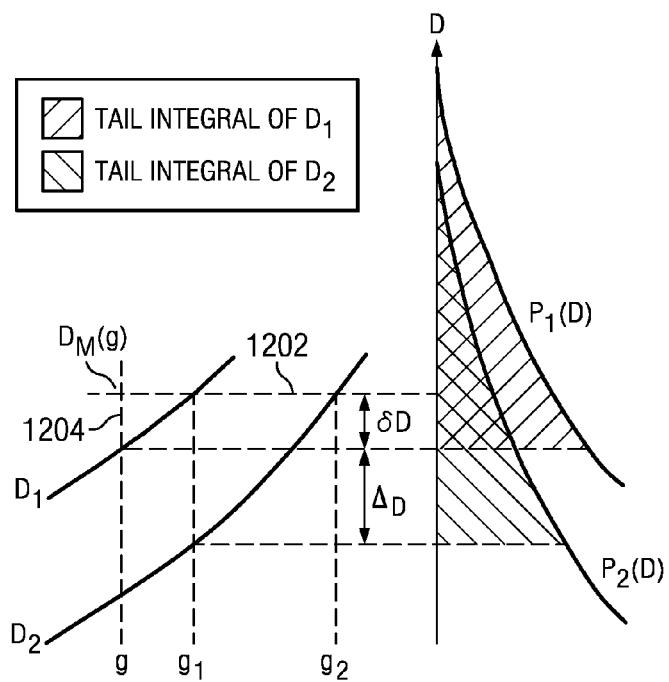
FIG. 11 is a plot illustrating two delay paths where $P_1(D) > P_2(D)$, with an exact solution for $D_M(g)$.

FIG. 11 is a plot illustrating two delay paths where $P_1(D) > P_2(D)$. As mentioned earlier, for two convergent paths in which the f-sigma delay for the two paths are very different, the default algorithm is correct. Therefore, an algorithm is needed that gives the above result when the f-sigma delay of two paths is identical, and gives the default algorithm when the two paths have very different f-sigma delay. Consider again the circuit in FIG. 9, where $D_1$ & $D_2$ have different PDFs. Consider the case where $D_1(g) > D_2(g)$. The g-sigma tails of $P_1(D)$ and $P_2(D)$ are shown cross-hatched in FIG. 11. The tail of $P_2(D)$ adds to the $P_1(D)$ tail. Therefore, $D_M(g) > D_i(g)$ by some unknown amount $\delta D$. The value of $D_M(g)$ can be determined by equation 23.

$$\Phi(g) = \int_{D_M(g)}^\infty P_M(\xi)\,d\xi \quad (23)$$
$$= \int_{D_1(g_1)}^\infty P_1(\xi)\,d\xi + \int_{D_2(g_2)}^\infty P_2(\xi)\,d\xi$$
$$= \Phi(g_1) + \Phi(g_2)$$

Note that $D_M(g)=D_1(g_1)=D_2(g_2)$. All three of these points lie on a horizontal line 1202 defined by $\delta D$. Equation (23) is an exact solution. It can, in principal, be solved by adjusting the value of $\delta D$ until Equation (23) is satisfied. Once Equation (23) is satisfied, $D_M(g)$ is defined by the intersection of the horizontal line 1202 with the coordinate g 1204. This also defines $\delta g=g_1-g$ for which $D_M(g)=D_1(g+\delta g)$. By following this procedure, the function $D_M(g)$ can be determined for arbitrary value of g.

Figure 12:
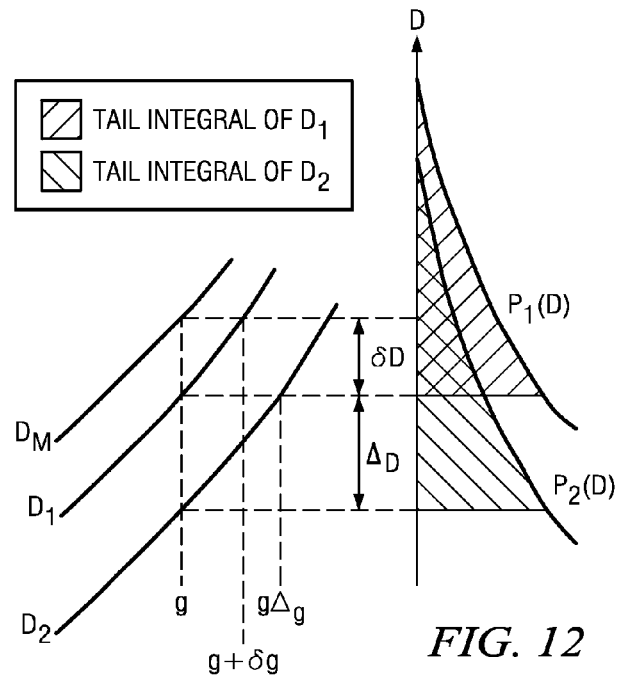
FIG. 12 is a plot illustrating two delay paths where $P_1(D) > P_2(D)$, with an approximate solution for $D_M(g)$.

FIG. 12 is a plot illustrating two delay paths where $P_1(D) > P_2(D)$, with an approximate solution for $D_M(g)$. Notice in FIG. 12 that $D_1(g) > D_2(g)$ by the amount $\Delta_D$. Next, make the assumption that in the vicinity of g, ie in the vicinity that makes the largest contribution to the tail integral of $D_M(g)$, $P_2$ is defined by equation 24.

$$P_2(D) \approx P_1(D+\Delta_D) \quad (24)$$

This leads to $$D_2(g) \approx D_1(g+\Delta_g) \text{ where } \Delta_g = \frac{\Delta_D}{\alpha_2} \text{ and } \alpha_2(g) = \frac{dD_2}{dg}$$

As before, a correction $\delta g=g_1-g$, such that $D_M(g)$ can be obtained from equation (25)

$$D_M(g)=D_1(g+\delta g) \quad (25)$$

As before, $\delta g$ can be obtained by solving Equation (23). However, the assumption of Equation (24) allows Equation (23) to be simplified to equation (26).

$$\Phi(g)=\Phi(g+\delta g)+\Phi(g+\delta g+\Delta_g) \quad (26)$$

Equations 25 and 26 define the Max-correction. When $\Delta_g$=0, these equations simplify to the case that was discussed above when $P_1(D)=P_2(D)$. And, when $\Delta_g$ is large, the correction is zero, and $P_M(D)=P_1(D)$.

The correction $\delta g$ depends on two parameters: g and $\Delta_g$. Table 2 shows calculations of this correction. The corrections are meaningful only for $g \geq 1.5$ because, for small g, the approximation in Equation (20) is not valid.

TABLE 2 calculated values for $\delta g$

| $\xi$ | $\Phi(\xi)$ | $\Delta_g=0$ $\xi+\delta\xi$ | $\Delta_g=0$ $\delta\xi$ | $\Delta_g=0.1$ $\xi+\delta\xi$ | $\Delta_g=0.1$ $\delta\xi$ | $\Delta_g=0.5$ $\xi+\delta\xi$ | $\Delta_g=0.5$ $\delta\xi$ | $\Delta_g=1.0$ $\xi+\delta\xi$ | $\Delta_g=1.0$ $\delta\xi$ |
|---|---|---|---|---|---|---|---|---|---|
| 0.5 | 0.3085375 | 1.018 | 0.518 | 0.950 | 0.450 | 0.800 | 0.300 | 0.645 | 0.145 |
| 1.0 | 0.1586553 | 1.410 | 0.410 | 1.360 | 0.360 | 1.205 | 0.205 | 1.081 | 0.081 |
| 1.5 | 0.0668072 | 1.833 | 0.333 | 1.785 | 0.285 | 1.640 | 0.140 | 1.544 | 0.044 |
| 2.0 | 0.0227501 | 2.278 | 0.278 | 2.230 | 0.230 | 2.095 | 0.095 | 2.024 | 0.023 |
| 2.5 | 0.0062097 | 2.736 | 0.236 | 2.690 | 0.190 | 2.565 | 0.065 | 2.513 | 0.013 |
| 3.0 | 0.0013499 | 3.205 | 0.205 | 3.159 | 0.159 | 3.045 | 0.045 | 3.007 | 0.007 |

Procedure for Computing Max Correction

Figure 13:
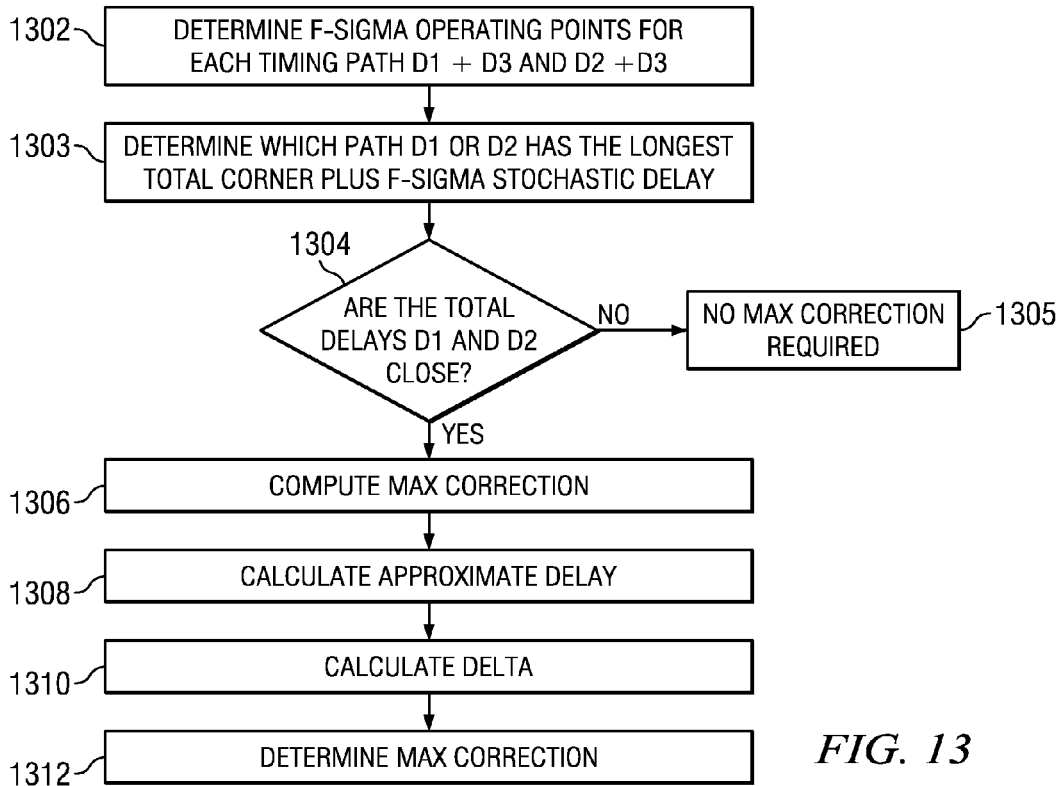
FIG. 13 is a flow diagram for calculating Max correction.

FIG. 13 is a flow diagram for calculating Max correction. Referring again to FIG. 9, determine 1302 f-sigma operating points for each timing path. In the example of FIG. 9, there is a timing path $D_1$–$D_3$ path with $D_1(g_1^{op})$ and a timing path $D_2$–$D_3$ path with $D_2(g_2^{op})$.

Determine which path D1 or D2 has the longest total stochastic plus corner delay 1303. If D1(g1op) and D2(g2op) are sufficiently close in value 1304, then compute 1306 the Max correction according to equations (25) and (26). If D1(g1op) and D2(g2op) are not close, no Max correction is required 1305.

If D1(g1op) and D2(g2op) are close to equal, the Max correction is computed, 1306. If D1(g1op)>D2(g2op) at 1303, then g1op>g2op. Compute 1308 an approximate delay according to equation (27).

$$D_2(g_1^{op}) \approx \alpha_2^{op}(g_1^{op}-g_2^{op})+D_2(g_2^{op}) \quad (27)$$

Next compute 1310 a delta according to equation (28).

$$\Delta_g = \frac{D_1(g_1^{op})-D_2(g_2^{op})}{\alpha_2^{op}} \quad (28)$$

Determine 1312 the value of δg from Table 2 and determine max correction by inserting this value into equation (29). The max correction to the TP is $\alpha_1^{OP}\delta g$ $$D_M(g_1^{OP}) = D_1(g_1^{OP}) + \alpha_1^{OP}\delta g \qquad (29)$$

It may be observed that the Max correction is, at most a 10% increase on the delay to the left of the point of convergence. If the convergence is early in the TP (ie if $D_1(g_1^{OP})$ and $D_2(g_2^{OP})$ are small compared to $D_3(g_3^{OP})$), the Max correction is a small percentage of the overall f-sigma TP delay. The worst case correction occurs when $D_1(g_1^{OP})$ and $D_2(g_2^{OP})$ are large compared to $D_3(g_3^{OP})$, and when $D_1(g_1^{OP}) \approx D_2(g_2^{OP})$. In this case, the Max correction may be ~10% of the overall TP delay.

Other Embodiments

Under some circumstances of low voltage operation, the PDF of the cell delay is Gaussian. In this case, the PDF can be completely determined by a mean and standard deviation. Cell delay has a Gaussian PDF whenever cell delay is linearly related to the underlying Local random variables. However, in general, the cell delay is not linear in the underlying Local random variables, and the cell delay PDF is non-Gaussian. The NLOPALV approach can be used whether the cell delay is Gaussian or non-Gaussian. However, other techniques are available in the Gaussian case, and the primary value of the NLOPALV approach is to accurately predict f-sigma delay when the cell PDF is non-Gaussian.

The techniques described in this disclosure may be implemented in hardware, software, firmware, or any combination thereof. If implemented in software, the software may be executed in one or more processors, such as a microprocessor, application specific integrated circuit (ASIC), field programmable gate array (FPGA), or digital signal processor (DSP). The software that executes the techniques may be initially stored in a computer-readable medium such as compact disc (CD), a diskette, a tape, a file, memory, or any other computer readable storage device and loaded and executed in the processor. In some cases, the software may also be sold in a computer program product, which includes the computer-readable medium and packaging materials for the computer-readable medium. In some cases, the software instructions may be distributed via removable computer readable media (e.g., floppy disk, optical disk, flash memory, USB key), via a transmission path from computer readable media on another digital system, etc.

Certain terms are used throughout the description and the claims to refer to particular system components. As one skilled in the art will appreciate, components in digital systems may be referred to by different names and/or may be combined in ways not shown herein without departing from the described functionality. This document does not intend to distinguish between components that differ in name but not function. In the discussion and in the claims, the terms "including" and "comprising" are used in an open-ended fashion, and thus should be interpreted to mean "including, but not limited to . . . ." Also, the term "couple" and derivatives thereof are intended to mean an indirect, direct, optical, and/or wireless electrical connection. Thus, if a first device couples to a second device, that connection may be through a direct electrical connection, through an indirect electrical connection via other devices and connections, through an optical electrical connection, and/or through a wireless electrical connection.

Although method steps may be presented and described herein in a sequential fashion, one or more of the steps shown and described may be omitted, repeated, performed concurrently, and/or performed in a different order than the order shown in the figures and/or described herein. Accordingly, embodiments of the invention should not be considered limited to the specific ordering of steps shown in the figures and/or described herein.

It is therefore contemplated that the appended claims will cover any such modifications of the embodiments as fall within the true scope and spirit of the invention.

REFERENCES

[1] M. Orshansky, S. R. Nassif, D. Bonning, Design for Manufacturability and Statistical Design, Springer, 2008.
[2] A. Asenov, "Random dopant induced threshold voltage lowering and fluctuations," Electron Devices, IEEE Transactions on, vol. 45, pp. 2505-2513, 1998.
[3] P. Andrei and I. Mayergoyz, "Random doping-induced fluctuations of subthreshold characteristics in MOSFET devices," Solid-State Electronics, vol. 47, pp. 2055-2061, 11. 2003.
[4] A. Agarwal, D. Blaauw, V. Zolotov, S. Sundareswaran, M. Zhao, K. Gala, R. Panda, "Path-based Statistical Timing Analysis Considering Inter and Intra-die Correlations", Proceedings of TAU 2002, pp 16-21, 2002.
[5] A. Agarwal, D. Blaauw, V. Zolotov, "Statistical Timing Analysis for Intra-die Process Variations with Spatial Correlations", Proceedings of ICCAD 2003, pp 900-907, 2003.
[6] H. Mangassarian, M. Anis, "On Statistical Timing Analysis with Inter- and Intra-die Variations", Proceedings of DATE 2005, pp. 132-137, 2005.
[7] K. Homma, I. Nitta, T. Shibuya, "Non-Gaussian Statistical Timing Models of Die-to-Die and Within-Die Parameter Variations for Full Chip Analysis", Proceedings of ASP-DAC 2008, pp. 292-297, 20008.
[8] S. Sundareswaran., J. A. Abraham, A. Ardelea, R. Panda, "Characterization of Standard Cells for Intra-Cell Mismatch Variations", Proceedings of the 9th international Symposium on Quality Electronic Design (Mar. 17-19, 2008). International Symposium on Quality Electronic Design. IEEE Computer Society, Washington, D.C., 213-219.

What is claimed is:

1. A method for simulating timing path delay of an integrated circuit design using a computer aided design (CAD) tool executed by a processor, the method comprising:
   determining by the CAD tool an estimated delay time for a timing path (TP) using non-linear Operating Point Analysis of Local Variations (NLOPALV), wherein NLOPALV comprises:
   determining an operating point (OP) for each of a plurality of cells each having an individual cell delay $D_i$ that form the timing path in the integrated circuit design, wherein the OP is a maximum in a joint probability of the delays $D_i$ on a curve where a composite first timing path delay equals an f-sigma delay; and
   wherein the OP is determined by fitting a probability density function (PDF) of each of the $D_i$ in the timing path with a Gaussian PDF in the immediate vicinity of the OP.

2. The method of claim 1, further comprising:
   simulating the f-sigma delay of the timing path by using a commercially available tool; and
   iterating through the timing path using the commercial tool, and updating the f-sigma operating points in order to self-consistently determine the operating points.

3. A method for simulating timing path delay of an integrated circuit design using a computer aided design (CAD) tool executed by a processor, the method comprising:
- determining by the CAD tool an estimated delay time for a timing path (TP) using non-linear Operating Point Analysis of Local Variations (NLOPALV), wherein NLOPALV comprises:
- determining an operating point (OP) for each of a plurality of cells each having an individual cell delay $D_i$ that form the timing path in the integrated circuit design, wherein the OP is a maximum in a joint probability of the delays $D_i$ on a curve where a composite first timing path delay equals an f-sigma delay; and
- wherein the OP is determined by linearizing a function $D^{TP}(D_1, D_2 \ldots D_N)$ that relates the TP delay to the individual cell delays $D_i$ of the timing path at the OP, where $D^{TP}$ is a total delay of the timing path, and by fitting a probability density function (PDF) of each of the $D_i$ in the timing path with a Gaussian PDF in the immediate vicinity of the OP.

4. The method of claim 3 in which the function $D^{TP}(D_1, D_2 \ldots D_N)$ is assumed to be approximately linear about the OP, and the PDFs of the $D_i$ are assumed to be approximately Gaussian in the vicinity of the OP, and linear-Gaussian theory is used to determine the OP.

5. The method of claim 4 in which each of the variables $D_i$ are transformed using a cell-arc delay function (CADF) to a synthetic variable $\xi_i$, and the OP is determined in $\xi_i$-space.

6. The method of claim 5 in which the OP in $\xi_i$-space is determined using the relations $$\xi_i^{OP} = \frac{f \alpha_i^{OP}}{\sqrt{\sum_j (\alpha_j^{op})^2}}$$

where linear Gaussian coefficients $\alpha_i^{OP}$ are calculated from the derivative of $D^{TP}$ vs $D_i$ at the OP, such that $$\alpha_i^{OP} = \left(\frac{dD^{TP}}{dD_i}\right)_{OP} \left(\frac{dD_i}{d\xi_i}\right)_{OP}$$

and the effective sigma at the OP is determined using the relation, $$\sigma_i^{eff} = \frac{dD_i}{d\xi_i}.$$

7. The method of claim 6, in which the OP is determined in an iterative manner, comprising:
- assuming an OP in $\xi_i$-space;
- determining the $\alpha_i^{OP}$;
- calculating the OP $\xi_i^{OP}$;
- comparing the calculated OP to the initially assumed OP;
- when they are sufficiently close in value, a self-consistent OP has been achieved, otherwise repeat the steps of determining, calculating and comparing with the just calculated OP; and
- evaluating the f-sigma TP delay at the OP, using the relationship $$D_{f\sigma}^{TP} = D^{TP}(\xi_1^{OP}, \xi_2^{OP} \ldots \xi_N^{OP})$$

once a self-consistent value of OP has been achieved.

8. The method of claim 3 in which an effect of input slew is calculated in terms of the delays of previous stages.

9. The method of claim 8, wherein for at least one of the cells in the timing path, the operating point is determined by treating slew rate from a previous stage as a random variable while calculating the operating point for the at least one cell.

10. The method of claim 9, wherein the operating point for the at least one cell is calculated as a synthetic variable $\xi_i$, and the OP is determined in $\xi_i$-spaces as follows:

$$\xi_i^{OP} = \frac{f(\alpha_i + \eta_i + \lambda_i)}{\sqrt{\sum_j (\alpha_j + \eta_j + \lambda_j)^2}}$$

where $$\alpha_i = \left(\frac{dD}{d\xi_i}\right)_{OP}$$

$$\eta_i = \left(\frac{dD_{i+1}}{d\xi_i}\right)_{OP} = \left(\frac{dD_{i+1}}{dS_i}\right)_{OP} \left(\frac{dS_i}{d\xi_i}\right)_{OP}$$

$$\lambda_i = \left(\frac{dD_{i+2}}{d\xi_i}\right)_{OP} = \left(\frac{dD_{i+2}}{dS_{i+1}}\right)_{OP} \left(\frac{dS_{i+1}}{dS_i}\right)_{OP} \left(\frac{dS_i}{d\xi_i}\right)_{OP}$$

where $S_i$ is the output slew for the $i^{th}$ cell.

11. The method of claim 10, wherein determining the f-sigma TP delay at the OP uses the following equations:

$$D_{f\sigma}^{TP} = \sum_{i=1}^{N} D_i(\xi_i^{OP}) + \sum_{i=1}^{N-1} D_{i+1,i}(\xi_i^{OP}) + \sum_{i=1}^{N-2} D_{i+2,i}(\xi_i^{OP});$$

$$D_{i+1,i}(\xi_i^{OP}) = \left(\frac{dD_{i+1}}{dS_i}\right)_{OP} S_i(\xi_i^{OP}); \text{ and}$$

$$D_{i+2,i}(\xi_{iOP}) = \left(\frac{dD_{i+2}}{dS_{i+1}}\right)_{OP} \left(\frac{dS_{i+1}}{dS_i}\right)_{OP} S(\xi_i^{OP})$$

where $S_1$ is the output slew for the $i^{th}$ cell.

12. A method for simulating timing path delay of an integrated circuit design using a computer aided design (CAD) tool executed by a processor, the method comprising:
- determining by the CAD tool an estimated delay time for a timing path (TP) using non-linear Operating Point Analysis of Local Variations (NLOPALV), wherein NLOPALV comprises:
- determining an operating point (OP) for each of a plurality of cells each having an individual cell delay $D_i$ that form the timing path in the integrated circuit design, wherein the OP is a maximum in a joint probability of the delays $D_i$ on a curve where a composite first timing path delay equals an f-sigma delay; and
- wherein the TP delay $D^{TP}$ is approximately a linear sum of cell delays $D_i$, where $D^{TP}$ is a total delay of the timing path such that $$D^{TP} \approx \sum_i D_i \text{ and where } f\text{-sigma } TP \text{ delay at the } OP \text{ is}$$

$$D_{f\sigma}^{TP} = D^{TP}(\xi_1^{OP}, \xi_2^{OP} \ldots \xi_N^{OP}) \approx \sum_i D_i^{OP}.$$

13. A method for simulating timing path delay of an integrated circuit design using a computer aided design (CAD) tool executed by a processor, the method comprising:

determining by the CAD tool an estimated delay time for a timing path (TP) using non-linear Operating Point Analysis of Local Variations (NLOPALV), wherein NLOPALV comprises:

determining an operating point (OP) for each of a plurality of cells each having an individual cell delay $D_i$ that form the timing path in the integrated circuit design, wherein the OP is a maximum in a joint probability of the delays $D_i$ on a curve where a composite first timing path delay equals an f-sigma delay;

further comprising:

calculating an operating point for each of a plurality of cells that form a second timing path in the integrated circuit design; and performing setup/hold analysis by modifying a polarity of one or more of the calculated operating points to realize a subtraction operation.

14. The method of claim 13, further comprising centering the operating point at zero for cells that are common to both the first timing path and to the second timing path.

15. A method for simulating timing path delay of an integrated circuit design using a computer aided design (CAD) tool executed by a processor, the method comprising:

determining by the CAD tool an estimated delay time for a timing path (TP) using non-linear Operating Point Analysis of Local Variations (NLOPALV), wherein NLOPALV comprises:

determining an operating point (OP) for each of a plurality of cells each having an individual cell delay $D_i$ that form the timing path in the integrated circuit design, wherein the OP is a maximum in a joint probability of the delays $D_i$ on a curve where a composite first timing path delay equals an f-sigma delay;

further comprising determining an OP for a second delay path, wherein the two timing paths converge; and approximating an f-sigma TP delay for the converged TP by selecting the path that has the longest total delay at the point of convergence, wherein total delay comprises corner delay and f-sigma delay.

16. A method for simulating timing path delay of an integrated circuit design using a computer aided design (CAD) tool executed by a processor, the method comprising:

determining by the CAD tool an estimated delay time for a timing path (TP) using non-linear Operating Point Analysis of Local Variations (NLOPALV), wherein NLOPALV comprises:

determining an operating point (OP) for each of a plurality of cells each having an individual cell delay $D_i$ that form the timing path in the integrated circuit design, wherein the OP is a maximum in a joint probability of the delays $D_i$ on a curve where a composite first timing path delay equals an f-sigma delay;

further comprising:

determining an estimated f-sigma delay time for a second timing path using NLOPALV, wherein the first timing path and the second timing path converge;

when the estimated operating point delay of the first timing path is approximately equal to the estimated operating point delay of the second timing path, then determine a merged path delay by:

determining which path has the longest operating point delay; and computing a convergent path correction, comprising a shift to the operating point, wherein the shift in operating point is determined from a pre-computed table.

\* \* \* \* \*